(12) United States Patent
Gerdes et al.

(10) Patent No.: US 8,970,291 B1
(45) Date of Patent: Mar. 3, 2015

(54) METHOD OF DEBOUNCING A VARIABLE FREQUENCY STEP SIGNAL

(71) Applicant: Caterpillar Inc., Peoria, IL (US)

(72) Inventors: Jesse R Gerdes, Dunalp, IL (US); Jackson Wai, Dunlap, IL (US); Benjamin Paul Gottemoller, Princeville, IL (US); Sangameshwar Sonth, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 14/101,408

(22) Filed: Dec. 10, 2013

(51) Int. Cl.
H03L 9/00 (2006.01)
H03K 17/16 (2006.01)
H03K 5/1252 (2006.01)

(52) U.S. Cl.
CPC ................... *H03K 5/1252* (2013.01)
USPC ...................................... 327/551

(58) Field of Classification Search
None
See application file for complete search history.

(56) References Cited

U.S. PATENT DOCUMENTS

| 7,579,894 B2 * | 8/2009 | Kejriwal | 327/386 |
| 8,558,606 B2 * | 10/2013 | Chen | 327/385 |
| 2008/0062017 A1 * | 3/2008 | Macaulay | 341/24 |

* cited by examiner

*Primary Examiner* — Lincoln Donovan
*Assistant Examiner* — Terry L Englund

(57) ABSTRACT

A method of debouncing a variable frequency step signal is provided. The method includes the steps of: (a) determining a first period in oscillations of the variable frequency step signal and applying a first debounce time to debounce oscillations in the variable frequency step signal, (b) detecting a second period in the oscillations of the variable frequency step signal, (c) calculating a second debounce time as a fraction of the first period, (d) applying the second debounce time to debounce oscillations having the second period, and (e) repeating the steps (b)-(d) for debouncing successive oscillations of varying periods in the variable frequency step signal.

1 Claim, 2 Drawing Sheets

METHOD OF DEBOUNCING A VARIABLE FREQUENCY STEP SIGNAL

TECHNICAL FIELD

The present disclosure relates to debouncing signals, and more particularly to debouncing a variable frequency step signal.

BACKGROUND

Electronic systems may sometimes operate in environments containing factors, such as, for example, vibrations, electrical noise, radio frequency (RF) interference, electromagnetic interference (EMI), temperature, and humidity. These factors produce low or high frequency oscillations in electronic signals and thus, affect the functioning of the electronic systems. In some cases, these electronic signals are input to switches or switch-circuits. The variations in the frequency of the electronic signals may cause erratic or undesirable responses from the electronic system.

Systems to debounce electronic signals are well known in the art. However, these known systems are configured to debounce constant frequency oscillations in electronic signals. In an actual work environment, the frequency of the oscillations may vary and hence, there exists a need for a system and a method that serves to debounce variable frequency oscillations in electronic signals.

SUMMARY

In one aspect, the present disclosure provides a method of debouncing a variable frequency step signal. The method includes the steps of (a) determining a first period in oscillations of the variable frequency step signal and applying a first debounce time to debounce oscillations in the variable frequency step signal, (b) detecting a second period in the oscillations of the variable frequency step signal, (c) calculating a second debounce time as a fraction of the first period, (d) applying the second debounce time to debounce oscillations having the second period, and (e) repeating the steps (b)-(d) for debouncing successive oscillations of varying periods in the variable frequency step signal.

Other features and aspects of this disclosure will be apparent from the following description and the accompanying drawings.

DETAILED DESCRIPTION

Figure 1:
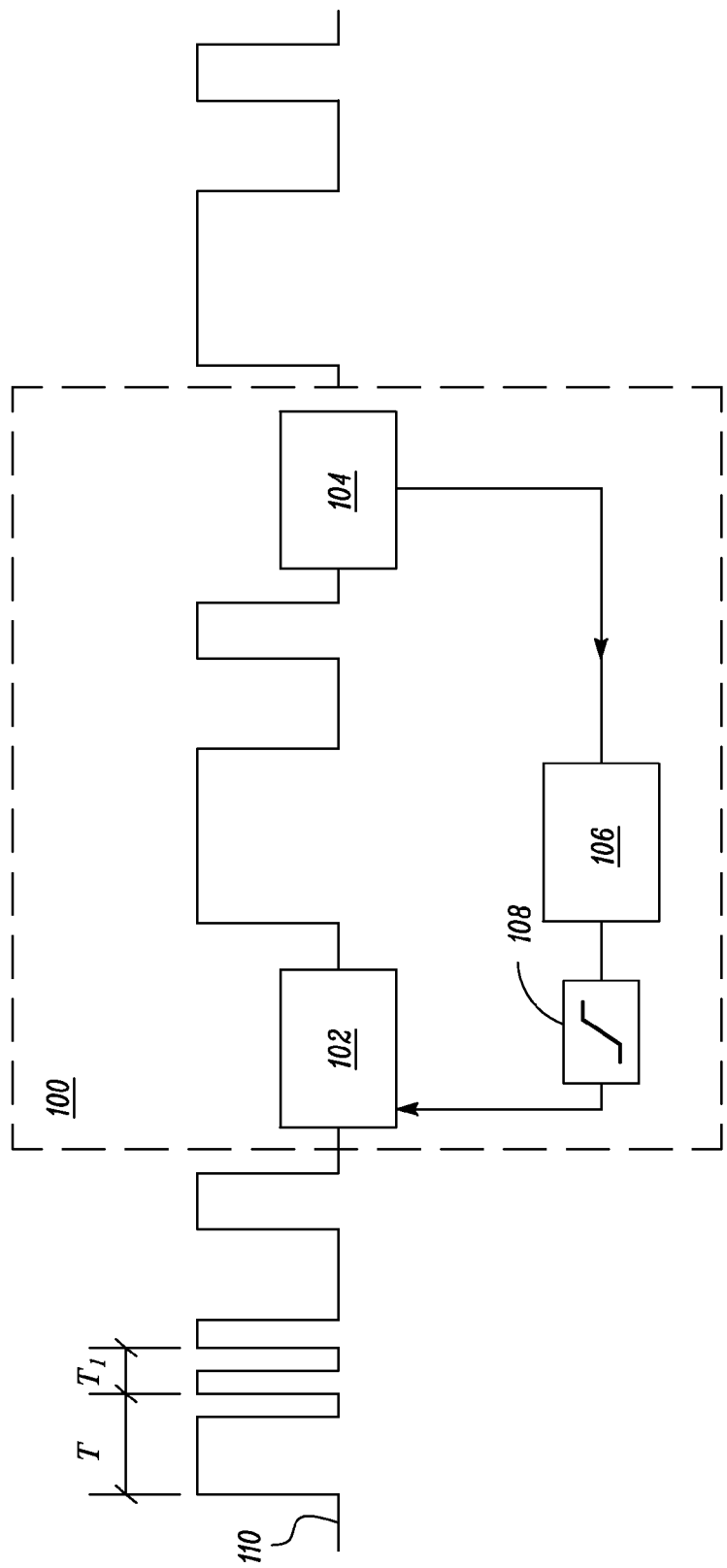
FIG. 1 is a schematic view of an exemplary system employed for debouncing a variable frequency step signal, in accordance with an embodiment of the present disclosure.

The present disclosure relates to debouncing signals, and more particularly to debouncing a variable frequency step signal. FIG. 1 illustrates a schematic view of an exemplary system 100 employed for debouncing a variable frequency step signal. The exemplary system 100 may be associated with an electronic system (not shown) where debouncing of signals is required. The system 100 may be embodied in, but not limited to, a printed circuit board (PCB), a field-programmable gate array (FPGA), or an application-specific integrated circuit (ASIC).

As shown in FIG. 1, the system 100 may include a debouncer 102, a measuring unit 104, a calculating unit 106, and a limiter 108, but not limited thereto. The debouncer 102, the measuring unit 104, the calculating unit 106, and the limiter 108 may be connected to form a closed-loop circuit or a feedback-loop circuit therebetween.

A variable frequency step signal 110 is input at the debouncer 102. The debouncer 102 may be initially set with a first debounce time and configured to debounce oscillations of a first period or frequency in the variable frequency step signal 110 based on the first debounce time. For example, if a threshold value of 25 milliseconds (ms) is used to set the first debounce time at the debouncer 102, the debouncer 102 may debounce oscillations of 20 Hz in the variable frequency step signal 110.

The measuring unit 104 is configured to measure a change X in the period of the variable frequency step signal 110, and therefore detect if the period of the variable frequency step signal 110 has changed. The measuring unit 104 may include, for example, a sampler, a counter, a timer, a sample evaluator, and other components, as known commonly known in the art, in order to measure the period of the variable frequency step signal 110. In an exemplary embodiment, the measuring unit 104 may employ a sampling frequency or rate based upon the frequency of the variable frequency step signal 110. For example, as shown in FIG. 1, if the period of the variable frequency step signal 110 changes from the first period to a second period, for example, T to $T_1$, where T=100 milliseconds and $T_1$=60 milliseconds, the measuring unit 104 measures the change X=40 milliseconds according to the mathematical expression $$X = T - T_1 \qquad \text{equation (1).}$$

By using equation (1), if the change X is a positive value, i.e. a difference between T and $T_1$ is positive, then it can be inferred that a period of the variable frequency step signal 110 has decreased. Similarly, if the equation (1) yields a negative value for the change X, it can be inferred that the period of the variable frequency step signal 110 has increased.

Alternatively, in terms of the frequency of the variable frequency step signal 110, a positive value of the change X may indicate that the frequency of the variable frequency step signal 110 has increased, while a negative value of the change X may indicate that the frequency of the variable frequency step signal 110 has decreased.

Therefore, by virtue of measuring the change X in period, the measuring unit 104 may detect the change X in the period of the variable frequency step signal 110. Thereafter, the measuring unit 104 may be additionally configured to communicate the first period T to the calculating unit 106.

The calculating unit 106 is configured to calculate a second debounce time based on the first period T. Specifically, the calculating unit 106 calculates the second debounce time as a fraction of the first period T. For example, the second debounce time may be T*N, where T is the first period, and N is a constant determined by the system 100 based on a predefined criteria.

In one exemplary embodiment, if the measuring unit 104 records a positive change X in the period of the variable frequency step signal 110, i.e., for example, T=90 milliseconds, and $T_1$=20 milliseconds, then change X=T−$T_1$=90−20=70 milliseconds. The calculating unit 106 uses a value, say 0.25 for the constant N, and calculates a new debounce time, i.e., the second debounce time. Therefore, in this case, the second debounce time may be T*N=90*0.25=22.5 milliseconds.

In another exemplary embodiment, if the measuring unit 104 records a negative change X in the period of the variable frequency step signal 110, i.e., for example, T=20 milliseconds, and $T_1$=30 milliseconds, then change X=T-$T_1$=20-30=-10 milliseconds. However, the calculating unit 106 calculates a new debounce time, i.e. the second debounce time, by employing the same constant value N, i.e., 0.25. Therefore, in this case, the second debounce time may be T*N=20*0.25=5 milliseconds.

In view of the foregoing exemplary embodiments, a person having ordinary skill in the art may acknowledge that the second debounce time is a function of the first period T.

Further, in a preferred embodiment of the present disclosure, it is envisioned to employ a large debounce time while debouncing a low frequency signal, and a small debounce time for debouncing a high frequency signal. For example, if the period of the signal is large, say 100 milliseconds, then the second debounce time may be calculated to be large, say 80 milliseconds. However, if the period of the signal is small, say 50 milliseconds, then the second debounce time may be calculated to be small, say 20 milliseconds. It is to be noted that the terms of comparison such as "large", "small", "high", "low" disclosed herein are used to aid the reader's understanding of the present disclosure. Therefore, such terms of the present disclosure are to be taken only in the illustrative and explanatory sense, and in no way be construed as limiting to the present disclosure.

The limiter 108 may be configured to apply the calculated second debounce time and debounce the oscillations having the second period at the debouncer 102. In an alternative embodiment, the limiter 108 may be configured to communicate the calculated second debounce time to the debouncer 102, while the debouncer 102 applies the calculated second debounce time to debounce the oscillations having the second period in the variable frequency step signal 110.

It is to be noted that the second debounce time is periodically calculated based on the sampling rate or sampling frequency of the measuring unit 104. Thereafter, the first debounce time is replaced with the second debounce time. Therefore, the system 100 is configured to overwrite an "old" debounce time i.e. the first debounce time initially set at the debouncer 102 with a "new" calculated debounce time i.e. the second debounce time for debouncing the oscillations in the variable frequency step signal 110. Therefore, the process of debouncing, as disclosed herein, is subject to the repetitive or recursive calculation and application of the new debounce time, i.e., the second debounce time based on the first period T of the variable frequency step signal 110.

The terms of expression "new" and "old", as disclosed herein, are used keeping in mind the recursive nature of the process of calculation, and application of the second debounce time in lieu of the first debounce time each time a change X is detected in the period of the variable frequency step signal 110. Therefore, such terms are used to aid the reader's understanding of the present disclosure and should be taken only in the illustrative and explanatory sense rather than being construed as limiting of the present disclosure.

Further, the period of the variable frequency step signal 110, disclosed herein, may be for example, an instantaneous period taken over adjacent oscillations in the variable frequency step signal 110, a mean period measured across a pre-specified number of oscillations, or an average period taken by the measuring unit 104 based on its sampling frequency or sampling rate. Various methods of measuring the period of the variable frequency step signal 110 are commonly known to a person ordinarily skilled in the art and hence, such methods may be suitably selected for implementation in the measuring unit 104. However, it is to be noted that the system 100 of the present disclosure is configured to debounce the oscillations in the variable frequency step signal 110 independent of the manner of measurement of the period by the measuring unit 104.

Furthermore, in an aspect of the present disclosure, when two or more variable frequency step signals 110 of substantially similar frequency are received by the system 100, the system 100 may consider the first period T from one of the variable frequency step signals 110 and measure the second debounce time therefrom. Thereafter, the system may apply the second debounce time uniformly across each of the variable frequency step signals 110 while debouncing the two or more variable frequency step signals 110. The selection of a variable frequency step signal 110 from two or more variable frequency step signals 110 to determine the second debounce time may be based on a pre-defined criterion of the system 100.

Figure 2:
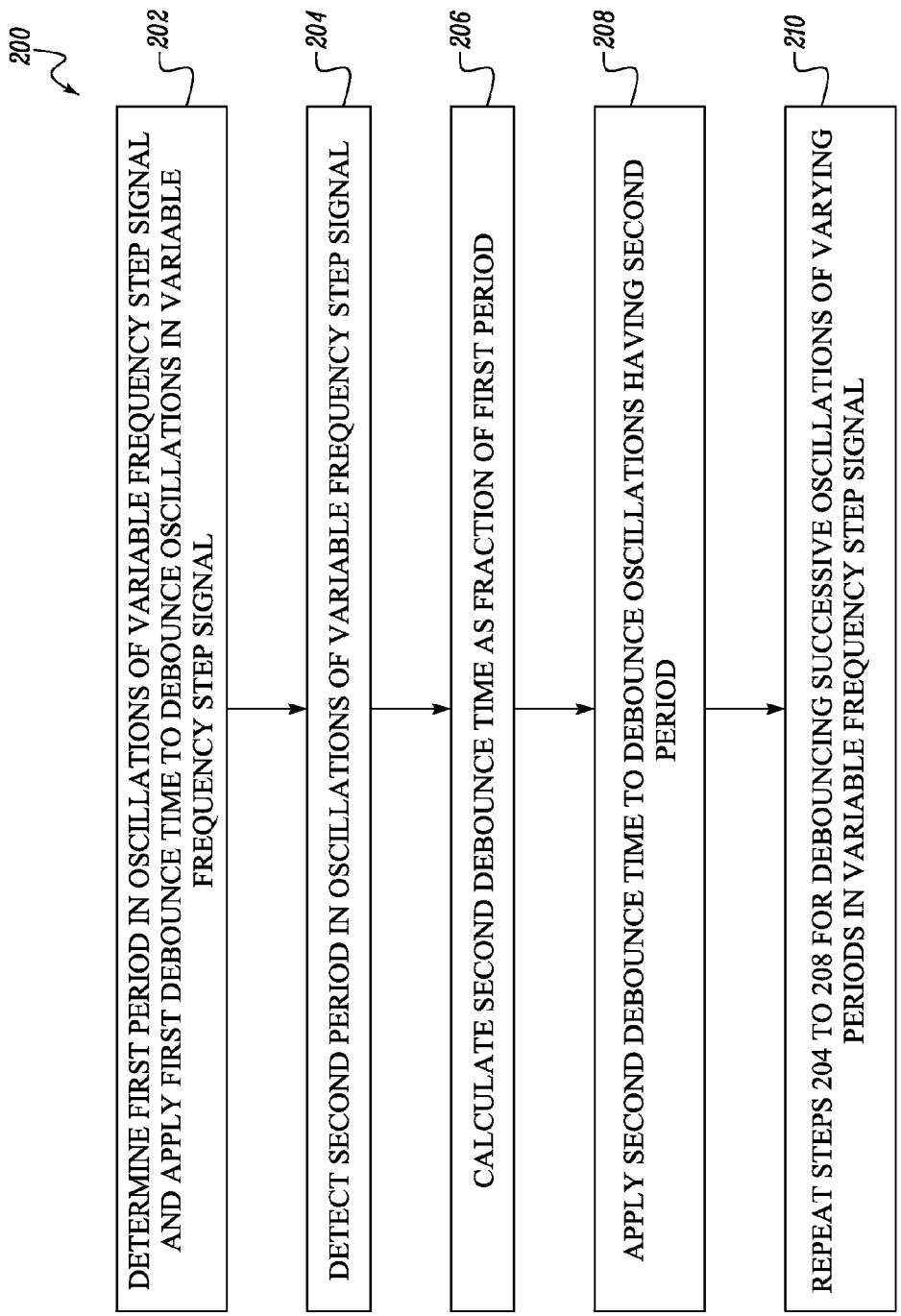
FIG. 2 is a method employed by the system of FIG. 1.

FIG. 2 illustrates a method 200 of debouncing a variable frequency step signal 110. At step 202, the method includes determining the first period T of the variable frequency step signal 110 and applying the first debounce time to debounce the oscillations in the variable frequency step signal 110. At step 204, the method 200 further includes detecting the second period $T_1$ in the oscillations of the variable frequency step signal of the variable frequency step signal 110. At step 206, the method 200 further includes calculating the second debounce time as the fraction of the first period T. At step 208, the method 200 further includes applying the second debounce time to debounce the oscillations having the second period $T_1$ in the variable frequency step signal 110. At step 210, the method 200 further includes repeating the steps 204 to 208 for debouncing successive oscillations of varying periods in the variable frequency step signal 110.

The foregoing description illustrates a preferred embodiment of the present disclosure and ways in which it can be implemented. Although the best mode of carrying out the method of the present disclosure has been disclosed, those skilled in the art would recognize that other embodiments for carrying out or practicing the present disclosure are also possible.

INDUSTRIAL APPLICABILITY

Although previously known systems in the art accomplished debounce of oscillations in signals, the previously known systems were only configured to debounce the oscillations of a constant frequency. Therefore, when the frequency of signals varied, the previously known systems rendered an output signal containing some portions of the signals in their original state i.e. with little or no debounce.

The method 200 of the present disclosure serves to debounce variable frequency step signals 110 where high and low frequency oscillations are encountered. The method 200 debounces oscillations in the signals 110 irrespective of the variations in the frequencies. When embodied in the system 100 and executed therefrom, the method 200 helps to debounce oscillations when the frequency of oscillations the electronic signals change, and where the changes in the frequency of oscillations may cause erratic or undesirable responses from the electronic system. Therefore, upon implementation of the method 200 disclosed herein, the method 200 may impart robustness to the electronic system associated therewith and hence, allow smooth operation of the electronic system in environments containing factors such as, but not limited to, vibration, electrical noise, radio frequency (RF) interference, electromagnetic interference (EMI), temperature, and humidity.

While aspects of the present disclosure have been particularly shown and described with reference to the embodiments above, it will be understood by those skilled in the art that various additional embodiments may be contemplated by the modification of the disclosed machine, systems and methods without departing from the spirit and scope of what is disclosed. Such embodiments should be understood to fall within the scope of the present disclosure as determined based upon the claims and any equivalents thereof.

We claim:

1. A method of debouncing a variable frequency step signal, the method comprising the steps of:
   (a) determining a first period in oscillations of the variable frequency step signal and applying a first debounce time to debounce oscillations in the variable frequency step signal;
   (b) detecting a second period in the oscillations of the variable frequency step signal;
   (c) calculating a second debounce time as a fraction of the first period;
   (d) applying the second debounce time to debounce oscillations having the second period; and
   (e) repeating the steps (b)-(d) for debouncing successive oscillations of varying periods in the variable frequency step signal.

* * * * *